United States Patent [19]

Nozawa et al.

[11] Patent Number: 5,825,707
[45] Date of Patent: Oct. 20, 1998

[54] SEMICONDUCTOR DEVICE AND SRAM HAVING PLURAL POWER SUPPLY VOLTAGES

[75] Inventors: Yasumitsu Nozawa, Yokohama; Kenichi Nakamura, Sumida-ku; Takayuki Otani, Hachioji; Makoto Segawa, Yokohama, all of Japan

[73] Assignee: Kabushiki Kaisha Toshiba, Tokyo, Japan

[21] Appl. No.: 882,393

[22] Filed: Jul. 10, 1997

[30] Foreign Application Priority Data

Jul. 11, 1996 [JP] Japan .................................. 8-182451
May 28, 1997 [JP] Japan .................................. 9-138741

[51] Int. Cl.$^6$ .................................................. G11C 7/00
[52] U.S. Cl. ...................... 365/226; 365/189.09; 257/372
[58] Field of Search ............................. 365/189.09, 226; 257/372

[56] References Cited

U.S. PATENT DOCUMENTS

| | | | |
|---|---|---|---|
| 4,862,415 | 8/1989 | Nakano | 365/189.09 |
| 5,192,883 | 3/1993 | Kimura | 307/475 |
| 5,305,275 | 4/1994 | Yamashita et al. | 365/226 |
| 5,321,647 | 6/1994 | Bronner et al. | 365/149 |
| 5,497,023 | 3/1996 | Nakazato et al. | 257/394 |

Primary Examiner—David C. Nelms
Assistant Examiner—Hien Nguyen
Attorney, Agent, or Firm—Loeb & Loeb LLP

[57] ABSTRACT

A semiconductor device comprises: a first circuit (11) formed in a first well (N-type) and a second well (P-type) of a semiconductor substrate, supplied with a first supply voltage ($V_{ss}$) and a second supply voltage ($V_{cc}$) higher than the first supply voltage, and activated when a first well bias voltage ($V_{BP1}$) is applied to the first well (N-type) and a second well bias voltage ($V_{BN1}$) is applied to the second well (P-type); a second circuit (201; 202) formed in a third well (N-type) and a fourth well (P-type) of the same semiconductor substrate as above, supplied with the first supply voltage ($V_{ss}$) and a third supply voltage ($V_{cc2}$) higher than the first supply voltage but different from the second supply voltage ($V_{cc}$), and activated when a third well bias voltage ($V_{BP2}$) is applied to the third well (N-type) and a fourth well bias voltage ($V_{BN2}$) is applied to the fourth well (P-type); a first bias circuit (20) supplied with the first and second supply voltages ($V_{ss}$ and $V_{cc}$), for generating and outputting the first well bias voltage ($V_{BP1}$); a second bias circuit (21) supplied with the first and second supply voltages ($V_{ss}$ and $V_{cc}$), for generating and outputting the second well bias voltage ($V_{BN1}$); a third bias circuit (16) supplied with the first and third supply voltages ($V_{ss}$ and $V_{cc2}$) for generating and outputting the third well bias voltage ($V_{BP2}$); and a fourth bias circuit (17) supplied with the first and third supply voltages ($V_{ss}$ and $V_{cc2}$) for generating and outputting the fourth well bias voltage ($V_{BN2}$). In the semiconductor device, even if any of the second supply voltage ($V_{cc}$) and the third supply voltage ($V_{cc2}$) is first supplied, it is possible to prevent the latch-up phenomenon caused by the floated substrate potential.

12 Claims, 9 Drawing Sheets

SEMICONDUCTOR DEVICE AND SRAM HAVING PLURAL POWER SUPPLY VOLTAGES

BACKGROUND OF THE INVENTION

The present invention relates to a semiconductor device and an SRAM (static random access memory), and more specifically to a semiconductor device including circuits activated when a plurality of external power supply voltages are supplied and further a plurality of bias voltages are applied to wells thereof.

In the semiconductor device, in particular, in the case of a memory device such as SRAM, a plurality of high supply voltages (e.g., 5 V and 3.3 V; or 3.3 V and 2.7 V) are often used.

FIG. 1 shows a circuit related to the present invention. In this circuit, a main circuit 31 is activated by supplying a supply voltage $V_{cc}$ and a ground voltage $V_{ss}$. On the other hand, an interface 101 composed of an interface circuit 32 and an attached circuit 33 and another interface 102 composed of an interface circuit 35 and an attached circuit 34 are both activated by supplying a supply voltage $V_{cc2}$ and the ground voltage $V_{ss}$. In operation, a signal inputted to the interface circuit 32 through an input terminal 38 is processed by the attached circuit 33, the main circuit 31, and the attached circuit 34, in sequence, and then outputted from the interface circuit 35 through an output terminal 39. Here, the relationship between the two supply voltages $V_{cc}$ and $V_{cc2}$ is $V_{cc} > V_{cc2}$.

Further, with respect to wells in which the main circuit 31, the interface circuits 32 and 35 and the attached circuits 33 and 34 are formed, a bias voltage $V_{BN}$ is applied to P-type wells thereof, and a bias voltage $V_{BP}$ is applied to N-type wells thereof, respectively. The bias voltage $V_{BP}$ is generated by a bias circuit 36, and the bias voltage $V_{BN}$ is generated by a bias circuit 37. These two bias circuits 36 and 37 are both activated by supplying the supply voltage $V_{cc}$ and the ground voltage $V_{ss}$, in the same way as with the case of the main circuit 31.

In the circuit device having a plurality of voltage supply systems as described above, however, there exists the following problem: on condition that $V_{cc} > V_{cc2}$, when the supply voltage $V_{cc}$ and the ground voltage $V_{ss}$ are first applied and further the supply voltage $V_{cc2}$ is secondly applied, the circuit device can operate normally. However, when the supply voltage $V_{cc2}$ and the ground voltage $V_{ss}$ are first applied and further the supply voltage $V_{cc}$ is secondly applied, the circuit device causes a latch-up phenomenon and thereby cannot operate normally.

FIG. 2 is a circuit in which the circuit construction as shown in FIG. 1 is applied to an SRAM. In this circuit, the main circuit 31 is composed of a memory cell and sense amplifier 31a, an address circuit 31c, a decode circuit 31b, a control circuit 31d, and an input/output circuit 31e, which are all activated by supplying a supply voltage $V_{cc}$ and a ground voltage $V_{ss}$. On the other hand, the interface is composed of two interfaces 32a and 35a, which are activated by supplying a supply voltage $V_{cc2}$ and the ground voltage $V_{ss}$. Further, a bias voltage $V_{BP}$ outputted by an N-type well bias circuit 36a is applied to N-type wells thereof, and a bias voltage $V_{BP}$ outputted by a P-type well bias circuit 37a is applied to P-type wells thereof. These N-type well bias circuit 36a and the P-type well bias circuit 37a are both activated by supplying the supply voltage $V_{cc}$ and the ground voltage $V_{ss}$.

In the circuit construction as described above, when the supply voltage $V_{cc}$ and the ground voltage $V_{ss}$ are first applied, the potential at the supply voltage terminal for supplying the voltage $V_{cc}$ is decided. At the same time, automatic pump circuits incorporated in the N-type well bias circuit 36a and the P-type well bias circuits 37a both start to oscillate, so that the two bias voltages $V_{BP}$ and $V_{BN}$ can be outputted. As a result, the circuits 31a, 31b, 31c, 31d, and 31e are all activated normally by the supply voltage $V_{cc}$. After that, when the supply voltage $V_{cc2}$ is applied to activate the two interface circuits 32a and 35a, these circuits 31a to 31e can maintain the normal operation.

However, as shown in FIG. 3, when the supply voltage $V_{cc2}$ and the ground voltage $V_{ss}$ are first applied, although only the two interfaces 32a and 35a are activated, the other main circuits 31a, 31b, 31c, 31d and 31e and the N-type well bias circuit 36a and the P-type well bias circuit 37a do not all start to operate. Accordingly, since not only the main circuit but also the bias circuits 36a and 37a are not activated, the bias voltages $V_{BP}$ and $V_{BN}$ are not generated, so that the two bias voltages are not applied to the wells, respectively. At this stage, the potential $V_{BN}$ to be applied to the P-type well is once stabilized at a potential obtained by adding a floating potential $\Delta V_F$ to the supply voltage $V_{ss}$, and the potential $V_{BP}$ to be applied to the N-type well is once stabilized at a potential obtained by subtracting a floating potential $\Delta V_F$ from the supply voltage $V_{cc2}$.

Under these conditions, when the supply voltage $V_{cc}$ is supplied, the potential $V_{cc}$ of the voltage supply terminal is decided, and further the bias circuits 36a and 37a both start to operate. In this case, however, when the two bias voltages $V_{BP}$ and $V_{BN}$ are applied to the wells, since the bias terminals connected to the wells are momentarily decoupled by the presence of the floating potential $\Delta V_F$, current flows in the forward direction through the PN junctions thereof, respectively into latch-up mode, with the result that the circuit device results in an inoperative condition.

SUMMARY OF THE INVENTION

Accordingly, it is the object of the present invention to provide a semiconductor device and an SRAM having a plurality of voltage supply systems, which can prevent erroneous operation due to latch-up phenomenon caused when the supply voltages are turned on.

To achieve the above-mentioned object, the present invention provides a semiconductor device, comprising: a first circuit formed in a first well and a second well of a semiconductor substrate, supplied with a first supply voltage and a second supply voltage higher than the first supply voltage, in which a first bias voltage is applied to the first and a second bias voltage is applied to the second well; a second circuit formed in a third well and a fourth well of a semiconductor substrate, supplied with the first supply voltage and a third supply voltage higher than the first supply voltage but different from the second supply voltage, in which a third bias voltage is applied to the third well and a fourth bias voltage is applied to the fourth well; a first bias circuit supplied with the first and second supply voltages, for generating and outputting the first bias voltage; a second bias circuit supplied with the first and second supply voltages, for generating and outputting the second bias voltage; a third bias circuit supplied with the first and third supply voltages, for generating and outputting the third bias voltage; and a fourth bias circuit supplied with the first and third supply voltages, for generating and outputting the fourth bias voltage.

As described above, in the semiconductor device according to the present invention, since the bias voltages are generated by the bias generating circuits provided for each supply voltage system, and since each generated bias voltage is applied to each well supplied with each different supply voltage, it is possible to prevent the occurrence of the latch-up phenomenon, irrespective of the supply order of the different supply voltages, with the result that the semiconductor device can be operated normally.

Here, it is preferable that the first, second, third and fourth wells are all formed on a surface of the same semiconductor substrate supplied with the first supply voltage.

Further, the first circuit includes a memory cell circuit, a sense amplifier, an address circuit, a decode circuit, and an input/output circuit; and the second circuit includes an interface circuit.

Further, in the semiconductor device according to the present invention, it is not necessarily required to provide all the bias circuits for applying the bias voltages to the first, second, third and fourth wells, respectively.

Therefore, the present invention provides a semiconductor device, comprising: a first circuit formed in a first well and a second well of a semiconductor substrate, supplied with a first supply voltage and a second supply voltage higher than the first supply voltage, in which a first bias voltage is applied to the first well and a second supply voltage is supplied to the second well; a second circuit formed in a third well and a fourth well of a semiconductor substrate, supplied with the first supply voltage and a third supply voltage higher than the first supply voltage but different from the second supply voltage, in which a second bias voltage is applied to the third well and the third supply voltage is supplied to the fourth well; a first bias circuit supplied with the first and second supply voltages, for generating and outputting the first bias voltage; and a second bias circuit supplied with the first and third supply voltages, for generating and outputting the second well bias voltage.

In contrast with this, the present invention provides a semiconductor device, comprising: a first circuit formed in a first well and a second well of a semiconductor substrate, supplied with a first supply voltage and a second supply voltage higher than the first supply voltage, in which the first supply voltage is supplied to the first well and a first bias voltage is applied to the second well; a second circuit formed in a third well and a fourth well of a semiconductor substrate, supplied with the first supply voltage and a third supply voltage higher than the first supply voltage but different from the second supply voltage, in which the first supply voltage is supplied to the third well and the second supply voltage is applied to the fourth well; a first bias circuit supplied with the first and second supply voltages, for generating and outputting the first bias voltage; and a second bias circuit supplied with the first and third supply voltages, for generating and outputting the second well bias voltage.

Here, it is preferable that the first, second, third and fourth wells are all formed on a surface of the same semiconductor substrate supplied with the first supply voltage.

Further, the first circuit includes a memory cell circuit, a sense amplifier, an address circuit, a decode circuit, and an input/output circuit; and the second circuit includes an interface circuit.

DETAILED DESCRIPTION OF THE PREFERRED EMBODIMENTS

Figure 4:
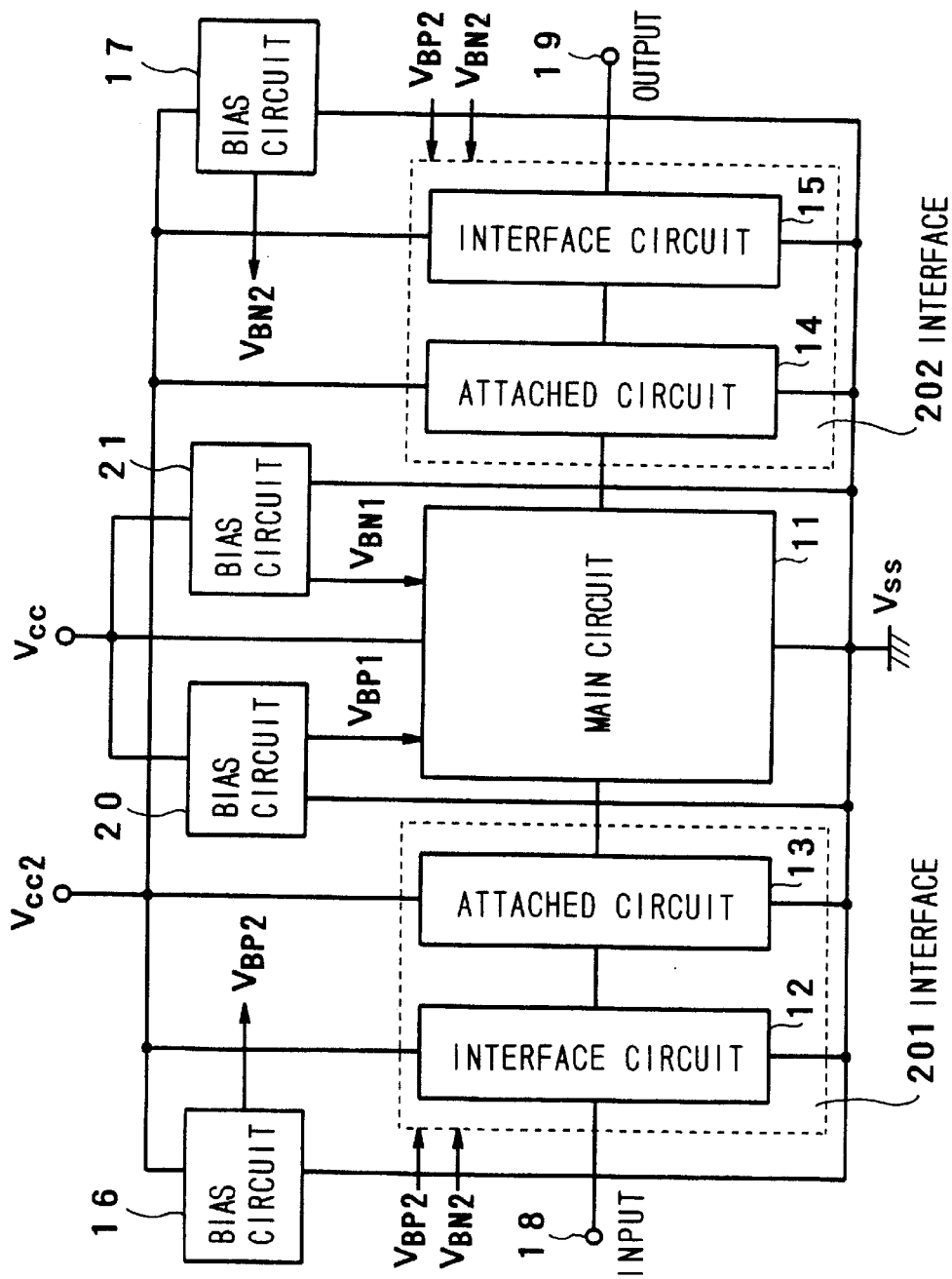
FIG. 4 is a first embodiment of the semiconductor device according to the present invention.

FIG. 4 shows the first embodiment of the semiconductor device according to the present invention. In this circuit, a main circuit 11 is activated by supplying a supply voltage $V_{cc}$ and a ground voltage $V_{ss}$. On the other hand, an interface 201 composed of an interface circuit 12 and an attached circuit 13 and another interface 202 composed of an interface circuit 15 and an attached circuit 14 are both activated by supplying a supply voltage $V_{cc2}$ and the ground voltage $V_{ss}$. In operation, a signal inputted to the interface circuit 12 through an input terminal 18 is processed by the attached circuit 13, the main circuit 11 and the attached circuit 14, in sequence, and then outputted from the interface circuit 15 through an output terminal 19. Here, the relationship between the two supply voltages $V_{cc}$ and $V_{cc2}$ is $V_{cc} > V_{cc2}$.

With respect to the wells in which the main circuit 11 is formed, a bias voltage $V_{BN1}$, is applied to a P-type well thereof, and a bias voltage $V_{BP1}$ is applied to an N-type well thereof, respectively. The bias voltage $V_{BP1}$ is generated by a bias circuit 20 and the bias voltage $V_{BN1}$ is generated by a bias circuit 21. These two bias circuits 20 and 21 are both activated by supplying the supply voltage $V_{cc}$ and the ground voltage $V_{ss}$ in the same way as with the case of the main circuit 11.

On the other hand, with respect to the well in which the interface circuits 12 and 15 and the attached circuits 13 and 14 are formed, a bias voltage $V_{BN2}$ is applied to P-type wells thereof, and a bias voltage $V_{BP2}$ is applied to N-type wells thereof, respectively. The bias voltage $V_{BP2}$ is generated by a bias circuit 16, and the bias voltage $V_{BN2}$ is generated by a bias circuit 17. These two bias circuits 16 and 17 are both activated by supplying the supply voltage $V_{cc2}$ and the groundvoltage $V_{ss}$, in the same way as with the case of the two interface circuits 12 and 15 and the two attached circuits 13 and 14.

As described above, in this first embodiment, the two bias voltages $V_{BP1}$ and $V_{BN1}$ generated by the two bias circuits 20 and 21 separately are applied to the wells in which the circuit system activated by supplying the two supply voltages $V_{cc}$ and the ground voltage $V_{ss}$ is formed. Further, the two bias voltages $V_{BP2}$ and $V_{BN2}$ generated by the two bias circuits 16 and 17 separately (both different from the bias circuits 20 and 21) are applied to the wells in which the circuit system activated by supplying the two supply voltages $V_{cc2}$ and the ground voltage $V_{SS}$ is formed. In other words, since the bias circuits 20 and 21 for the $V_{BP1}$ and $V_{BN1}$ system activated by $V_{cc}$ are provided separately from the bias circuits 16 and 17 for the $V_{BP2}$ and $V_{BP2}$ system activated by $V_{cc2}$, it is possible to generate different bias voltages separately. Therefore, even if any of the supply voltage $V_{cc}$ and the supply voltage $V_{cc2}$ is first supplied, it is possible to prevent the above-mentioned latch-up phenomenon.

Figure 1:
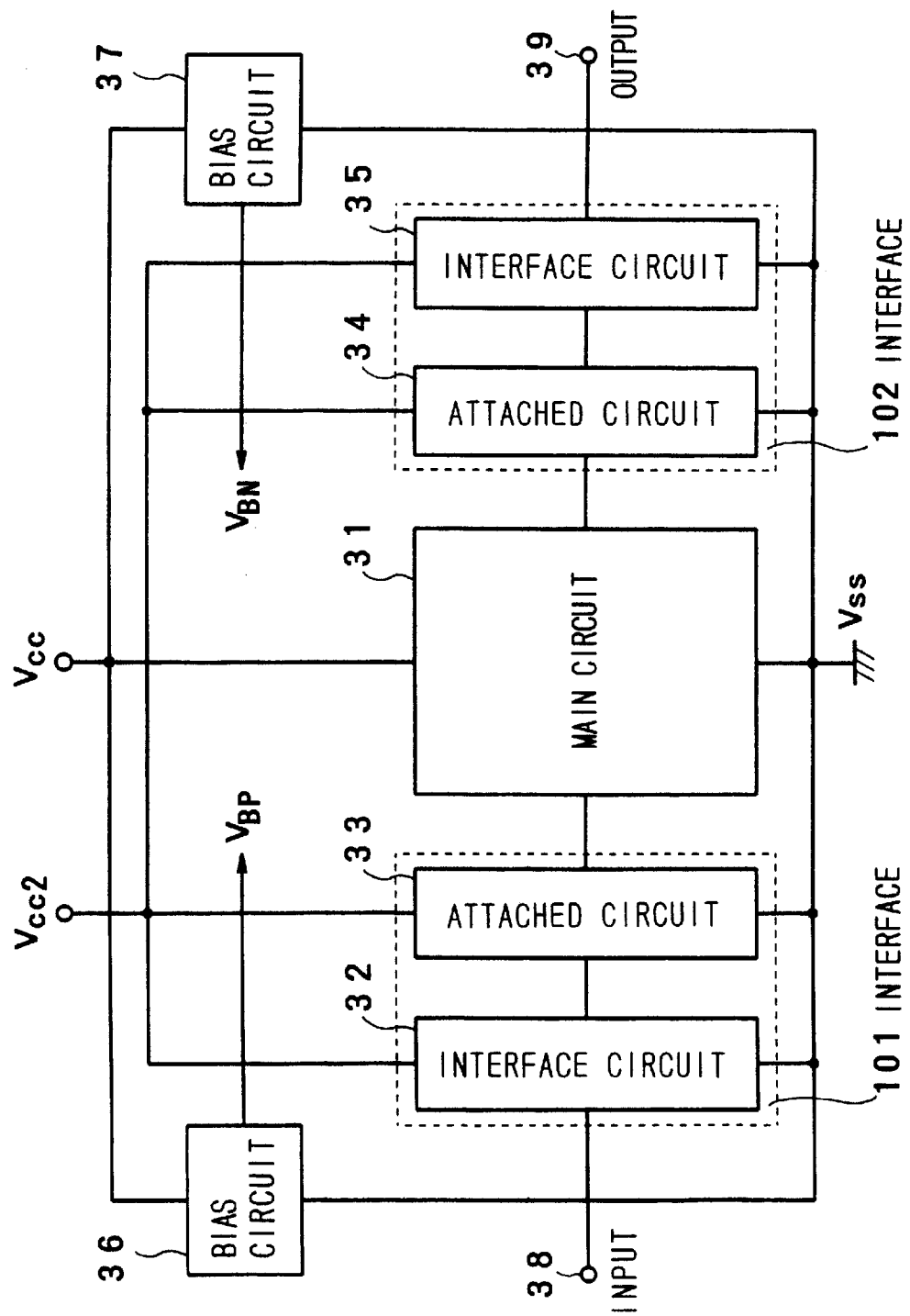
FIG. 1 is a circuit diagram showing a semiconductor device related to the present invention.
Figure 5:
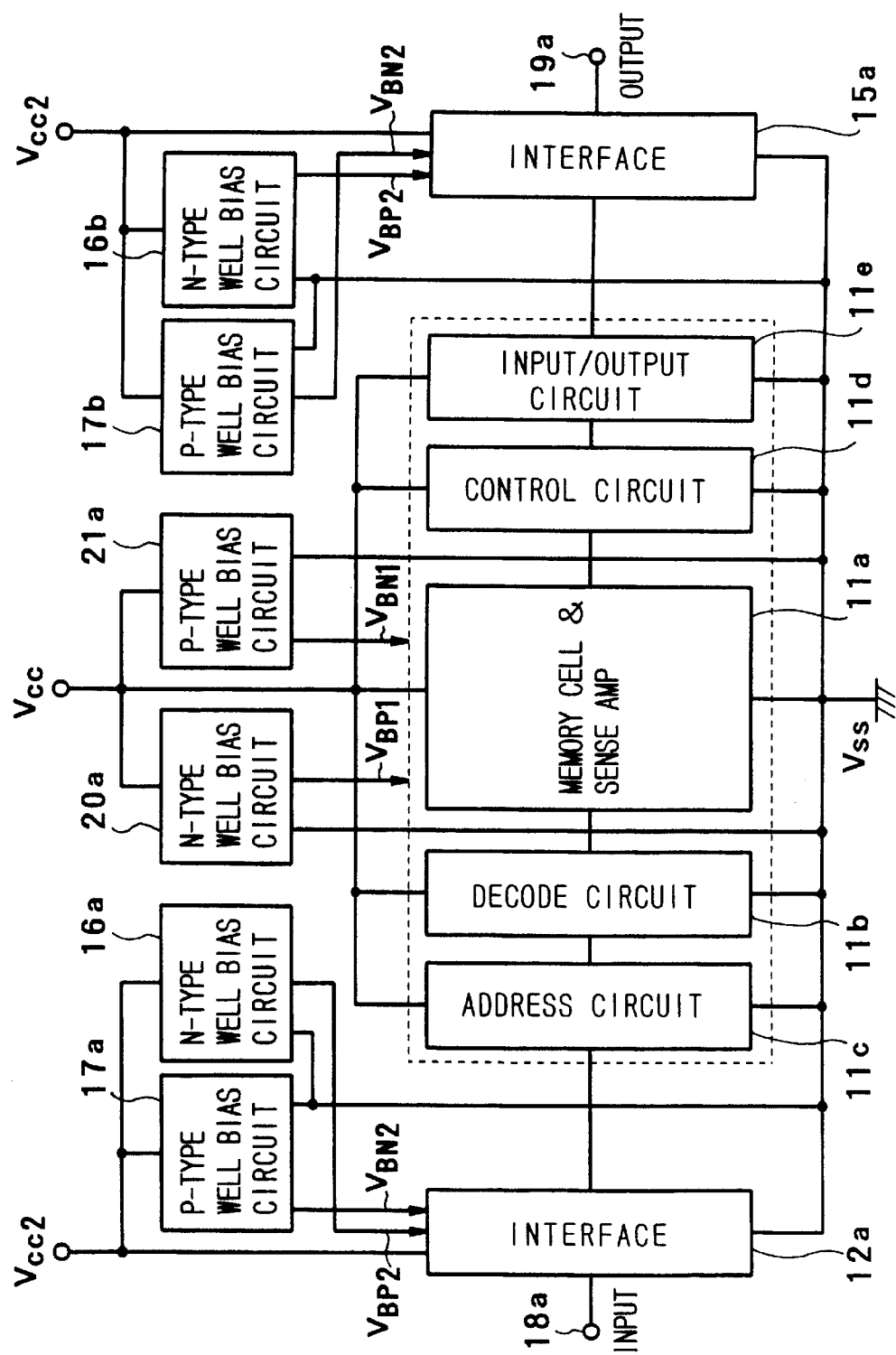
FIG. 5 is a second embodiment of the semiconductor device according to the present invention.

FIG. 5 shows the second embodiment of the semiconductor device according to the present invention, in which the gist of the present invention is applied to an SRAM as a more practical circuit construction. In this circuit shown in FIG. 5, the main circuit 11 of the first embodiment shown in FIG. 1 is replaced with a memory cell and sense amplifier 11a, an address circuit 11c, a decode circuit 11b, a control circuit 11d for executing various controls, and an input/output circuit 11e including an input buffer, which are all activated by supplying a supply voltage $V_{cc}$ and a ground voltage $V_{ss}$. Further, a bias voltage $V_{BP1}$ generated by an N-type bias circuit 20a is applied to N-type wells of the wells in which the main circuit composed of the circuits 11a, 11b, 11c, 11d and 11c is formed, and a bias voltage $V_{BN1}$ generated by a P-type bias circuit 21a is applied to P-type wells of the wells in which the main circuit 11 is formed. Further, the two bias circuits 20a and 21a are both activated by supplying a supply voltage $V_{cc}$ and the ground voltage $V_{ss}$, in the same way as with the case of the main circuit.

On the other hand, the two interfaces 201 and 202 of the first embodiment shown in FIG. 4 are replaced with the two interfaces 12a and 15a, respectively, and activated by the supply voltage $V_{cc2}$ and the ground voltage $V_{ss}$. A voltage $V_{BP2}$ outputted by an N-type well bias circuit 16a is applied to an N-type well for forming the interface 12a, and a voltage $V_{BN2}$ outputted by a P-type well bias circuit 17a is applied to a P-type well for forming the interface 12a. A voltage $V_{BP2}$ outputted by the N-type well bias circuit 16b is applied to an N-type well for forming the interface 15a, and a voltage $V_{BN2}$ outputted by a P-type well bias circuit 17b is applied to a P-type well for forming the interface 15a. Further, the supply voltage $V_{cc2}$ and the ground voltage $V_{ss}$ are both supplied to these four bias circuits 16a, 16b, 17a and 17b, respectively. As described above, in this second embodiment, the two bias circuits 20a and 21a for generating the bias voltages $V_{BP1}$ and $V_{BN1}$ to be applied to the main circuit activated by the supply voltage $V_{cc}$ are provided separately from the four bias circuits 16a, 16b, 17a and 17b for generating the bias voltages $V_{BP2}$ and $V_{BN2}$ to be applied to the two interfaces 12a and 15a activated by the supply voltage $V_{cc2}$, respectively.

The circuit operation of this second embodiment will be described hereinbelow, in particular when the supply voltage $V_{cc2}$ and the ground voltage $V_{ss}$ are both supplied before the supply voltage $V_{cc}$ is supplied.

When the supply voltage $V_{cc2}$ and the ground voltage $V_{ss}$ are both supplied, the potential of the supply voltage terminal rises and soon is stabilized at the voltage $V_{cc2}$, so that the bias circuits 16a, 16b, 17a and 17b supplied with this supply voltage $V_{cc2}$ are all activated, so that the bias voltages $V_{BP2}$ and $V_{BN2}$ are generated. In other words, when the potential of the supply voltage $V_{cc2}$ is rising, the P-type well bias voltage terminal is discharged by the voltage $V_{BN2}$, and the N-type well bias voltage terminal is charged by the voltage $V_{BP2}$. Therefore, the interfaces 12a and 15a supplied with the supply voltage $V_{cc2}$ and the ground voltage $V_{ss}$ can be activated to start operation thereof. In contrast with this, since the supply voltage $V_{cc}$ is not supplied to the bias circuits 20a and 21a, these bias circuits 20a and 21a are not activated, so that the bias voltages $V_{BN1}$ and $V_{BP1}$ are not supplied to the wells of the main circuit.

After that, when the supply voltage $V_{cc}$ is supplied, since the potential of the external supply voltage terminal rises, the two bias circuits 20a and 21a are both activated. The N-type wells in which the main circuit composed of the circuits 11a, 11b, 11c, 11d and 11e is formed is charged by the bias voltage $V_{BP1}$, and the P-type wells in which the main circuit is formed is discharged by the bias voltage $V_{BN1}$, so that the main circuit (11c, 11b, 11a, 11d, 11d and 11e) is activated.

As described above, in this second embodiment, the two bias voltages $V_{BP1}$ and $V_{BN1}$ are generated by the two bias circuits 20a and 21a and then applied to the wells in which the main circuit composed of the circuits 11a to 11e supplied with the supply voltage $V_{cc}$ is formed. Further, separately from the above, the two bias voltages $V_{BP2}$ and $V_{BN2}$ are generated by the four bias circuits 16a and 17a; 16b and 17b, respectively and then applied to the wells in which the interface circuits 12a and 15a supplied with the supply voltage $V_{cc2}$ are formed. As a result, it is possible to match the operation start timing between the supply voltage ($V_{cc}$) system circuit and its bias circuits and the operation start timing between the supply voltage ($V_{cc2}$) system circuit and its bias circuits, respectively. As a result, it is possible to prevent the latch-up phenomenon due to decoupling caused by the floating well potential as generated by the circuit shown in FIGS. 1 or 2. Therefore, it is possible to activate the circuit device normally, irrespective of the order of the supply voltages, that is, when any one of the two supply voltages $V_{cc}$ and $V_{cc2}$ is first supplied.

Figure 2:
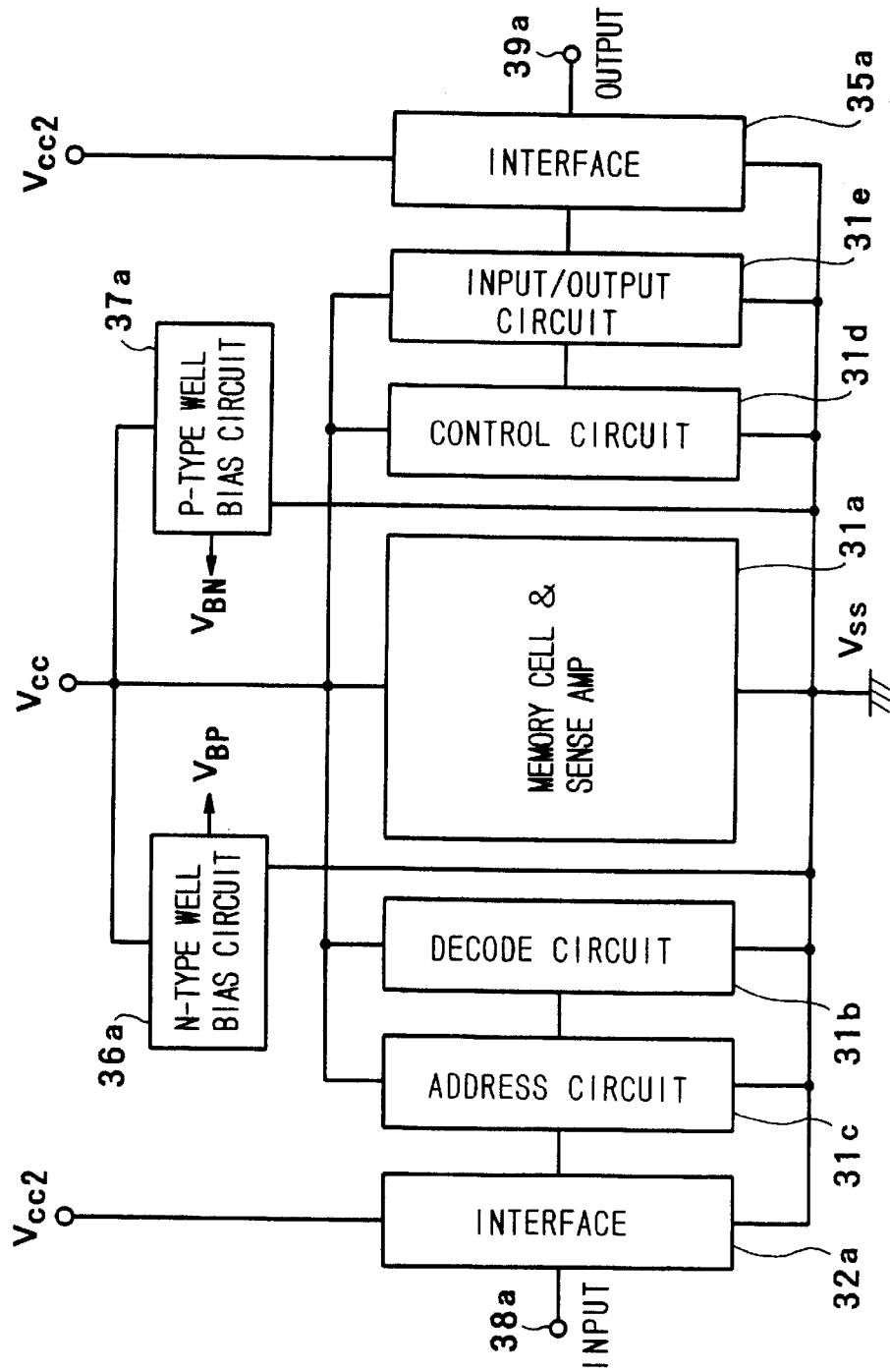
FIG. 2 is a circuit diagram showing another semiconductor device related to the present invention.
Figure 3:
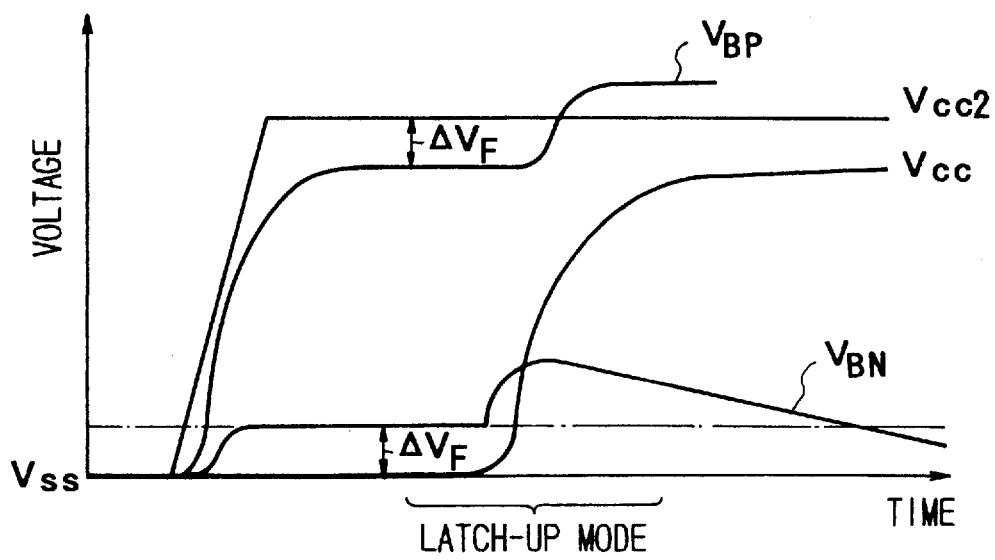
FIG. 3 is a graphical representation showing the changes of the two supply voltages and the two bias voltages applied to the semiconductor device shown in FIG. 2.

Further, in the circuits as shown in FIGS. 1 and 2, since the same two bias voltages $V_{BP}$ and $V_{BN}$ generated by the same two bias circuits are applied to both the wells in which the two different circuits supplied with two different supply voltages $V_{cc}$ and $V_{cc2}$ are formed, the substrate bias capacity must be determined on the basis of the circuit of a large-scale supply voltage system. In other words, it has been impossible to determined the bias circuit according to the substrate bias capacity determined on the basis of the circuit of a small-scale supply voltage system, with the result that the circuit scale of the bias circuits is inevitably increased. In contrast with this, in the first and second embodiments, since the necessary substrate bias capacity of the bias circuit can be determined according to each circuit scale of the supply voltage system circuit, it is possible to optimize the circuit scale of the bias circuit and thereby to minimize the power consumption and the circuit area thereof.

The above-mentioned first and second embodiments are described by way of example. Without being limited only to the above embodiments, the semiconductor device according to the present invention can be modified in various ways. For instance, in the case of the second embodiment, the SRAM includes the memory cell and sense amplifier, the address circuit, the decode circuit and the control circuit, as the main circuit; and further the two interfaces, as the attached circuits other than the main circuit. However, without being limited only to the SRAM, the present invention can be applied to a circuit device in which circuits are activated by two or more high supply voltages and further bias voltages are applied to the wells in which the respective circuits are formed for each supply voltage. Further, in the first and second embodiments, although the supply voltage $V_{cc}$ supplied to the main circuit is higher than the supply voltage $V_{cc2}$ supplied to the interface, the same effect can be obtained when the voltage relationship between the two is opposite to each other.

Further, in the first and second embodiments, the semiconductor device is activated by a plurality of high supply voltages $V_{cc}$ and $V_{cc2}$ and a single low supply voltage $V_{ss}$, and further both the N-type wells and the P-type wells formed in the same semiconductor substrate are biased by the bias voltages $V_{BP}$ and $V_{BN}$ generated by the substrate bias circuits. In more detail, the wells of the circuit system activated by the high supply voltage $V_{cc}$ are biased by the high bias voltage $V_{BP1}$ and the low bias voltage $V_{BN1}$ generated by one substrate bias circuit, and the wells of the circuit system activated by the high supply voltage $V_{cc2}$ are biased by the high bias voltage $V_{BP2}$ and the low bias voltage $V_{BN2}$ generated by the other substrate bias circuit. In other words, different substrate bias circuits are provided for each supply voltage system ($V_{cc}$ or $V_{cc2}$).

However, the present invention is not limited only to the above-mentioned circuit construction. For instance, the same effect can be obtained by biasing any one of the N-type well and the P-type well by use of an external supply voltage and by biasing the other of the N-type well and the P-type well by use of a bias voltage generated by the substrate bias circuit.

Figure 6:
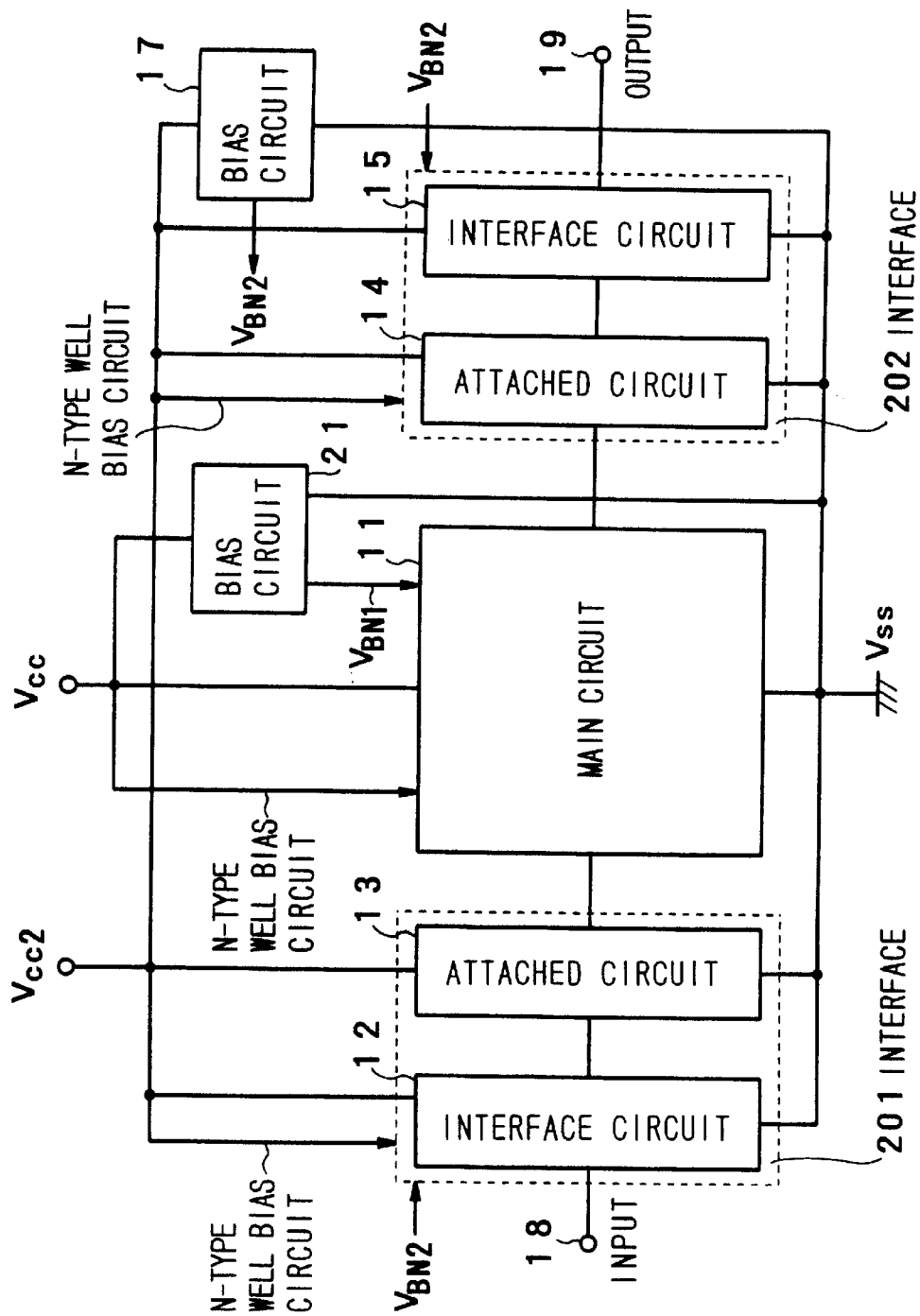
FIG. 6 is a third embodiment of the semiconductor device according to the present invention.

FIG. 6 shows the third embodiment of this case, in which although two P-type well bias circuits 21 and 17 are provided, the N-type well bias circuit is not provided. In the main circuit 11 activated by the supply voltage $V_{cc}$ and the ground voltage $V_{ss}$, the N-type well in which this main circuit 11 is formed is biased by the supply voltage $V_{cc}$, and the P-type well is biased by the substrate bias voltage $V_{BN1}$ generated by the bias circuit 21. Further, in the two interfaces 201 and 202 activated by the supply voltage $V_{cc2}$ and the ground voltage $V_{ss}$, the N-type wells thereof are biased by the supply voltage $V_{cc2}$, and the P-type wells thereof are biased by the substrate bias voltage $V_{BN2}$ generated by the bias circuit 17.

In this third embodiment, in the same way as with the case of the first and second embodiments, even if any of the high supply voltage $V_{cc}$ and the high supply voltage $V_{cc2}$ is first supplied, it is possible to prevent the latch-up phenomenon caused by the floated substrate potential.

Figure 7:
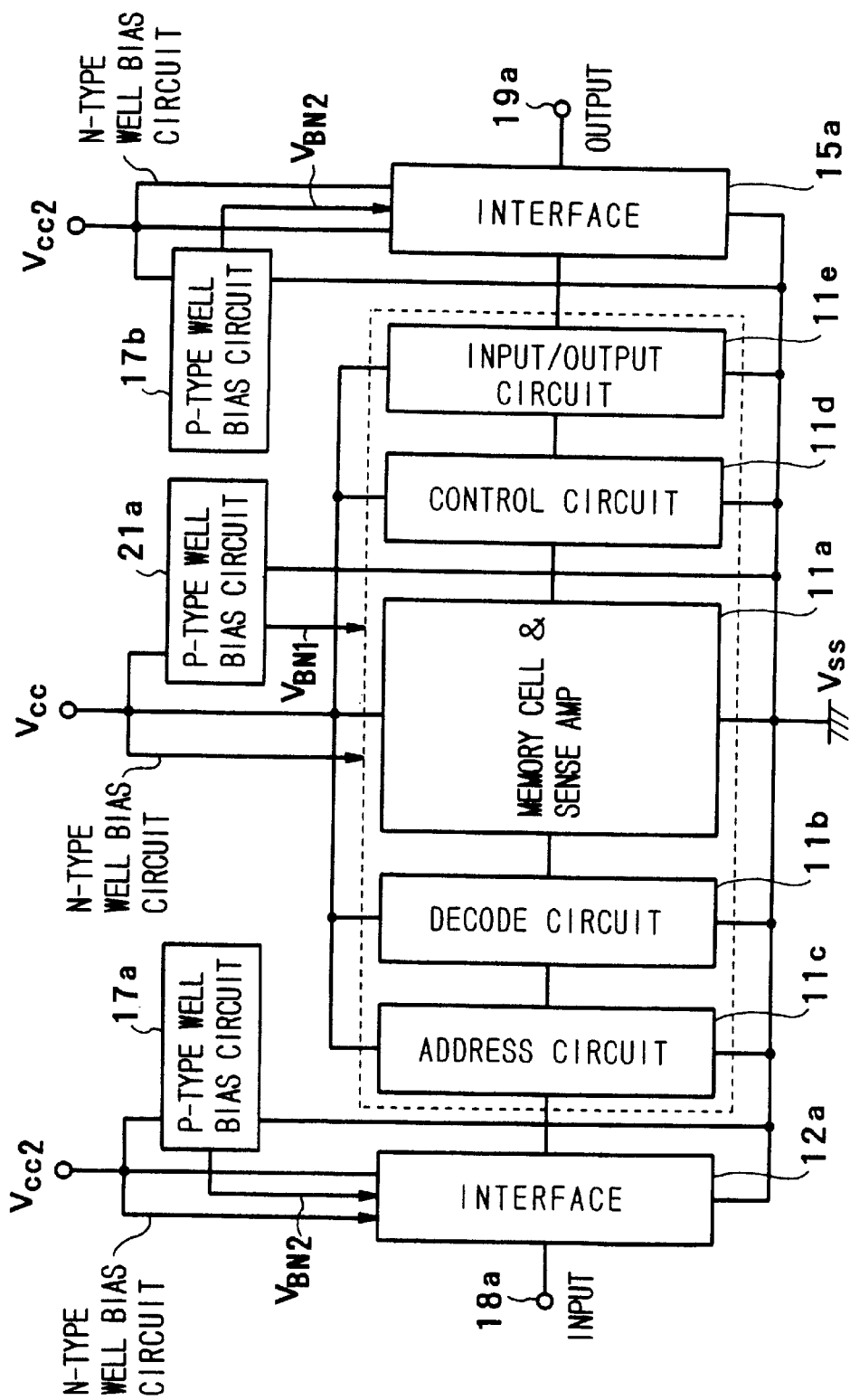
FIG. 7 is a fourth embodiment of the semiconductor device according to the present invention.

FIG. 7 shows the fourth embodiment, in which the same gist as with the case of the third embodiment is applied to the SRAM. In FIG. 7, the main circuit 11 of the first embodiment is replaced with the memory cell and sense amplifier 11a, the decode circuit 11b, the address circuit 11c, the control circuit 11d and the input/output circuit 11e. Further, the interface 201 is replaced with the interface 12a, and the interface 202 is replaced with the interface 15a, respectively. In this fourth embodiment, in the case way as with the case of the third embodiment, the N-type wells are biased by the supply voltage $V_{cc}$ or $V_{cc2}$, and the P-type wells are biased by the bias voltages $V_{BN1}$ and $V_{BN2}$ generated by the P-type well bias circuit 21a 17a and 17b, respectively. In more detail, the N-type wells of the memory cell and sense amplifier 11a, the decode circuit 11b, the address circuit 11c, the control circuit 11d, and the input/output circuit 11e are biased by the supply voltage $V_{cc}$; and the P-type wells thereof are biased by the substrate bias voltage $V_{BN1}$ generated by the bias circuit 21a. Further, in the two interfaces 12a and 15a, the N-type wells thereof are biased by the supply voltage $V_{cc2}$, and the P-type wells thereof are biased by the substrate bias voltage $V_{BN2}$ generated by the two bias circuits 17a and 17b, respectively.

Figure 8:
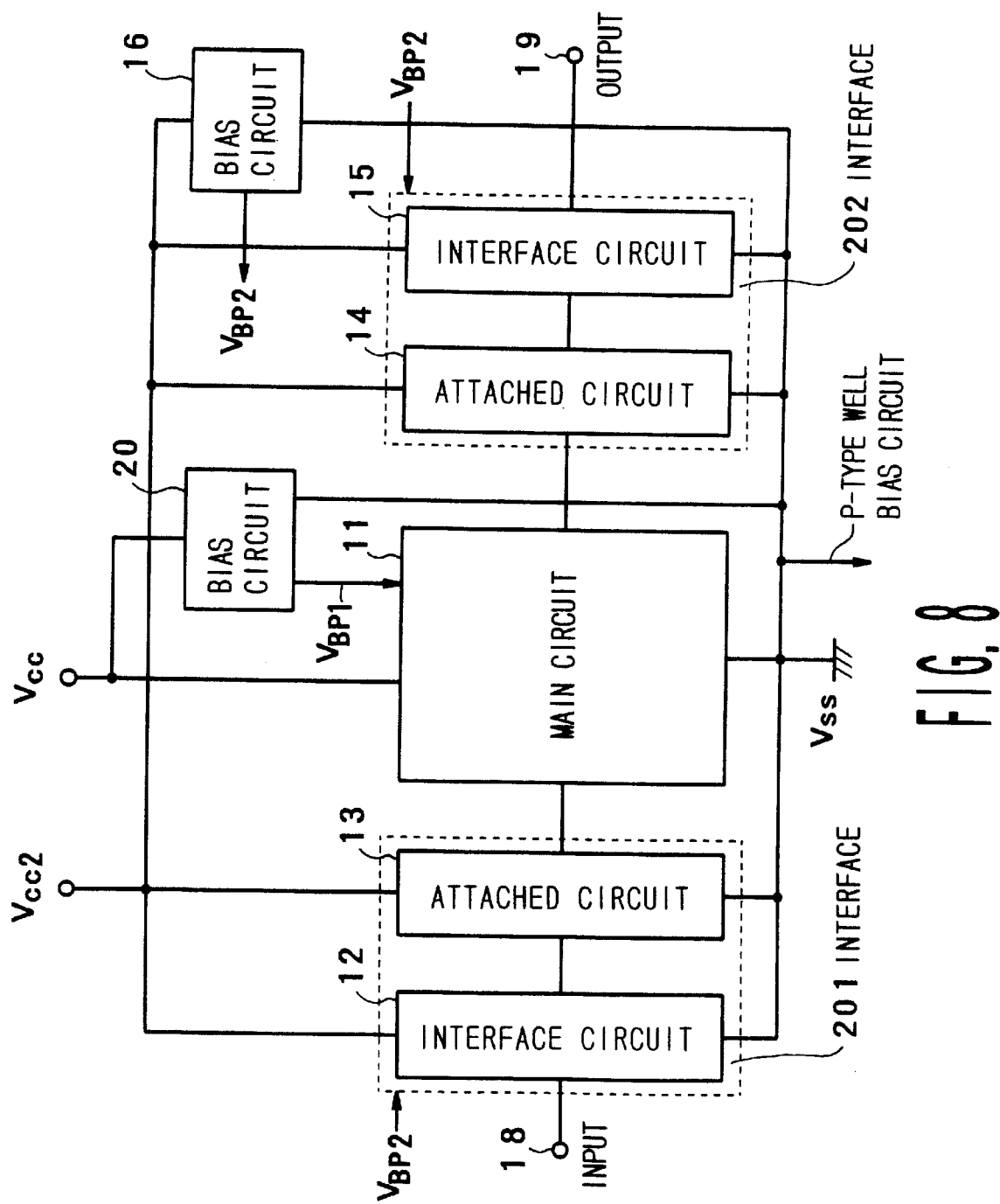
FIG. 8 is a fifth embodiment of the semiconductor device according to the present invention.
Figure 9:
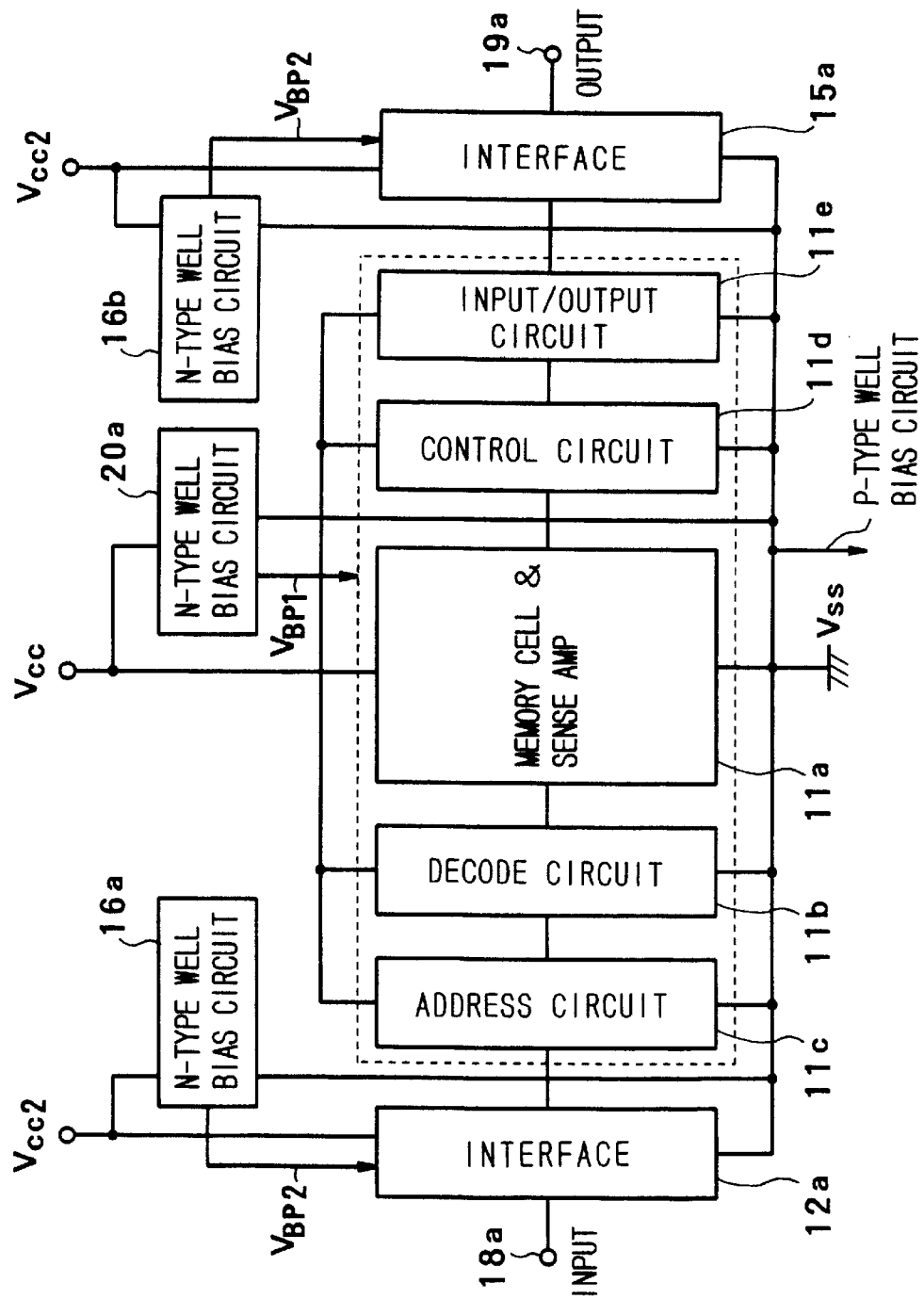
FIG. 9 is a sixth embodiment of the semiconductor device according to the present invention.

FIG. 8 shows the fifth embodiment, in which the two N-type well bias circuits 20 and 16 are provided but the P-type well bias circuits are not provided conversely in comparison with the third embodiment shown in FIG. 6. In the main circuit 11 activated by the supply voltage $V_{cc}$ and the ground voltage $V_{ss}$, the P-type well in which the main circuit 11 is formed is biased by the ground voltage $V_{ss}$, and the N-type well thereof is biased by the substrate bias voltage $V_{BP1}$ generated by the bias circuit 20. Further, in the two interfaces 201 and 202 activated by the supply voltage $V_{cc2}$ and the ground voltage $V_{ss}$, the P-type wells thereof are biased by the ground voltage $V_{ss}$, and the N-type wells thereof are biased by the substrate bias voltage $V_{BP2}$ generated by the bias circuits 16, respectively. FIG. 9 shows the sixth embodiment, in which the two N-type well bias circuits 20a, 16a and 16b are provided conversely in comparison with the fourth embodiment shown in FIG. 7. The P-type wells of the memory cell and sense amplifier 11a, the decode circuit 11b, the address circuit 11c, the control circuit 11d, and the input/output circuit 11e are biased by the ground voltage $V_{ss}$, and the N-type wells thereof are biased by the substrate bias voltage $V_{BP1}$ generated by the bias circuit 20a. Further, in the two interfaces 201 and 202 activated by the supply voltage $V_{cc2}$ and the ground voltage $V_{ss}$, the P-type wells thereof are biased by the ground voltage $V_{ss}$, and the N-type wells thereof are biased by the substrate bias voltage $V_{BP2}$ generated by the bias circuits 16a and 16b, respectively.

As described above, in the fifth and sixth embodiments, even if any of the high supply voltage $V_{cc}$ and the high supply voltage $V_{cc2}$ is first supplied, it is possible to prevent the latch-up phenomenon caused by the floated substrate potential.

What is claimed is:

1. A semiconductor device, comprising:

a first circuit formed in a first well and a second well of a semiconductor substrate, supplied with a first supply voltage and a second supply voltage higher than the first supply voltage, in which a first bias voltage is applied to the first well and a second bias voltage is applied to the second well;

a second circuit formed in a third well and a fourth well of a semiconductor substrate, supplied with the first supply voltage and a third supply voltage higher than the first supply voltage but different from the second supply voltage, in which a third bias voltage is applied to the third well and a fourth bias voltage is applied to the fourth well;

a first bias circuit supplied with the first and second supply voltages, for generating and outputting the first bias voltage;

a second bias circuit supplied with the first and second supply voltages, for generating and outputting the second bias voltage;

a third bias circuit supplied with the first and third supply voltages, for generating and outputting the third bias voltage; and a fourth bias circuit supplied with the first and third supply voltages, for generating and outputting the fourth bias voltage.

2. The semiconductor device of claim 1, wherein the first, second, third and fourth wells are all formed on a surface of the same semiconductor substrate supplied with the first supply voltage.

3. The semiconductor device of claim 1, wherein the first circuit includes a memory cell circuit, a sense amplifier, an address circuit, a decode circuit, and an input/output circuit; and the second circuit includes an interface circuit.

4. The semiconductor device of claim 2, wherein the first circuit includes a memory cell circuit, a sense amplifier, an address circuit, a decode circuit, and an input/output circuit; and the second circuit includes an interface circuit.

5. A semiconductor device, comprising:

a first circuit formed in a first well and a second well of a semiconductor substrate, supplied with a first supply voltage and a second supply voltage higher than the first supply voltage, in which a first bias voltage is applied to the first well and the second supply voltage is supplied to the second well;

a second circuit formed in a third well and a fourth well of a semiconductor substrate, supplied with the first supply voltage and a third supply voltage higher than the first supply voltage but different from the second supply voltage, in which a second bias voltage is applied to the third well and the third supply voltage is supplied to the fourth well;

a first bias circuit supplied with the first and second supply voltages, for generating and outputting the first bias voltage; and a second bias circuit supplied with the first and third supply voltages, for generating and outputting the second bias voltage.

6. The semiconductor device of claim 5, wherein the first, second, third and fourth wells are all formed on a surface of the same semiconductor substrate supplied with the first supply voltage.

7. The semiconductor device of claim 5, wherein the first circuit includes a memory cell circuit, a sense amplifier, an address circuit, a decode circuit, and an input/output circuit; and the second circuit includes an interface circuit.

8. The semiconductor device of claim 6, wherein the first circuit includes a memory cell circuit, a sense amplifier, an address circuit, a decode circuit, and an input/output circuit; and the second circuit includes an interface circuit.

9. A semiconductor device, comprising:

a first circuit formed in a first well and a second well of a semiconductor substrate, supplied with a first supply voltage and a second supply voltage higher than the first supply voltage, in which the first supply voltage is supplied to the first well and a first bias voltage is applied to the second well;

a second circuit formed in a third well and a fourth well of a semiconductor substrate, supplied with the first supply voltage and a third supply voltage higher than the first supply voltage but different from the second supply voltage, in which the first supply voltage is supplied to the third well and the second supply voltage is applied to the fourth well;

a first bias circuit supplied with the first and second supply voltages, for generating and outputting the first bias voltage; and a second bias circuit supplied with the first and third supply voltages, for generating and outputting the second bias voltage.

10. The semiconductor device of claim 9, wherein the first, second, third and fourth wells are all formed on a surface of the same semiconductor substrate supplied with the first supply voltage.

11. The semiconductor device of claim 9, wherein the first circuit includes a memory cell circuit, a sense amplifier, an address circuit, a decode circuit, and an input/output circuit; and the second circuit includes an interface circuit.

12. The semiconductor device of claim 10, wherein the first circuit includes a memory cell circuit, a sense amplifier, an address circuit, a decode circuit, and an input/output circuit; and the second circuit includes an interface circuit.

* * * * *